United States Patent
Hrina et al.

(10) Patent No.: US 10,739,224 B2
(45) Date of Patent: Aug. 11, 2020

(54) SYSTEMS AND METHODS TO SECURE FLAME SPREAD RESTRICTION OF INDIVIDUAL SUB-MODULES IN AN ULTRASONIC GAS LEAK DETECTOR

(71) Applicant: Honeywell International Inc., Morris Plains, NJ (US)

(72) Inventors: Lubos Hrina, Stara Lubovna (CZ); Mojmir Bombera, Brno (CZ); Jan Adamek, Brno (CZ); Rodney Royston Watts, Wimborne (GB); Martin Slamka, Hubina (SK)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 163 days.

(21) Appl. No.: 16/143,110

(22) Filed: Sep. 26, 2018

(65) Prior Publication Data
US 2020/0096411 A1    Mar. 26, 2020

(51) Int. Cl.
*G01L 19/14* (2006.01)
*G01L 19/06* (2006.01)
(Continued)

(52) U.S. Cl.
CPC ............ *G01M 3/24* (2013.01); *H05K 5/006* (2013.01); *H05K 5/0008* (2013.01);
(Continued)

(58) Field of Classification Search
CPC ............ G01L 19/0038; G01L 19/0645; G01L 19/147; G01L 19/0084; G01L 19/143;
(Continued)

(56) References Cited

U.S. PATENT DOCUMENTS 5,565,629 A    10/1996 Yamashita
8,318,525 B2 *  11/2012 Davies ............... G01N 27/16
                                                      422/83
(Continued)

FOREIGN PATENT DOCUMENTS

JP    2013-117439 A    6/2013

OTHER PUBLICATIONS

Extended European Search Report for Application No. 19199409.4, dated Feb. 24, 2020, 9 pages.
(Continued)

*Primary Examiner* — Brandi N Hopkins
(74) *Attorney, Agent, or Firm* — Alston & Bird LLP

(57) ABSTRACT

Example systems, apparatuses and methods are disclosed for detecting a gas leak. An example system comprises a sensor sub-module, a processor sub-module, and a barrier structure configured to restrict flame spread between the sensor sub-module and the processor sub-module. The barrier structure comprises a first housing part, a second housing part, and a printed circuit board disposed in a cavity structure formed by the first housing part and the second housing part. The barrier structure further comprises a first electrical connector configured to provide a first electrical connection to the sensor sub-module. The barrier structure further comprises a second electrical connector configured to provide a second electrical connection to the processor sub-module.

20 Claims, 7 Drawing Sheets

(51) Int. Cl.
*G01L 19/00* (2006.01)
*G01M 3/24* (2006.01)
*H05K 5/00* (2006.01)
*H05K 5/02* (2006.01)
*H05K 5/04* (2006.01)

(52) U.S. Cl.
CPC ......... *H05K 5/0052* (2013.01); *H05K 5/0247* (2013.01); *H05K 5/04* (2013.01)

(58) Field of Classification Search
CPC ........... G01N 30/88; G01N 2030/8881; G01N 2030/025; G01N 2030/0095; G01N 2030/8804; Y10T 137/87764; Y10T 137/87716; Y10T 137/87265; Y10T 137/87893; Y10T 137/86558
See application file for complete search history.

(56) References Cited

U.S. PATENT DOCUMENTS

| | | | |
|---|---|---|---|
| 8,671,753 B2 * | 3/2014 | Eckhardt | G01D 11/245 |
| | | | 73/431 |
| 8,792,658 B2 | 6/2014 | Baliga et al. | |
| 9,886,832 B2 * | 2/2018 | Pavlacka | G08B 5/36 |
| 2007/0095126 A1 * | 5/2007 | Bailey | G01N 30/88 |
| | | | 73/23.35 |
| 2017/0038294 A1 * | 2/2017 | Kshirsagar | G01N 29/42 |
| 2018/0172472 A1 | 6/2018 | Grant et al. | |

OTHER PUBLICATIONS

Communication pursuant to Rules 70(2) and 70a(2), for European Application No. 19199409.4 dated Apr. 6, 2020, 2 pages.

* cited by examiner

SYSTEMS AND METHODS TO SECURE FLAME SPREAD RESTRICTION OF INDIVIDUAL SUB-MODULES IN AN ULTRASONIC GAS LEAK DETECTOR

TECHNOLOGICAL FIELD

Example embodiments of the present disclosure relate generally to sensors and, more particularly, to ultrasonic gas leak detectors.

BACKGROUND

Industrial and commercial applications, including pressurized gas installations and processes, are increasingly utilizing gas leak sensors to detect gas leaks. However, conventional gas leak sensor designs cannot sufficiently prevent flame spread between components of the gas leak sensor, such as sensing and processing circuitry, easily and cost-effectively. Further, conventional gas leak sensors with sealed feedthrough designs are often too large for many applications.

Applicant has identified a number of deficiencies and problems associated with conventional gas leak sensors. Through applied effort, ingenuity, and innovation, many of these identified problems have been solved by developing solutions that are included in embodiments of the present disclosure, many examples of which are described in detail herein.

SUMMARY

Systems, apparatuses, and methods (including, but not limited to methods of manufacturing) are disclosed herein for providing an ultrasonic gas leak detector with a barrier structure configured to prevent or restrict flame spread between sub-modules of the ultrasonic gas leak detector.

In one example embodiment, a system is provided for detecting a gas leak. The system may comprise a sensor sub-module comprising sensor circuitry. The system may further comprise a processor sub-module comprising processing circuitry. The system may comprise a barrier structure disposed between the sensor sub-module and the processor sub-module. The barrier structure may be configured to restrict flame spread between the sensor sub-module and the processor sub-module The barrier structure may comprise a first housing part comprising a first cavity structure. The barrier structure may further comprise a second housing part comprising a second cavity structure. The barrier structure may further comprise a printed circuit board comprising a first surface and a second surface opposite the first surface. The printed circuit board may be disposed in a third cavity structure formed by the first cavity structure and the second cavity structure. The barrier structure may further comprise a first electrical connector disposed on the first surface of the printed circuit board and configured to provide a first electrical connection to the sensor circuitry disposed in the sensor sub-module. The barrier structure may further comprise a second electrical connector disposed on the second surface of the printed circuit board and configured to provide a second electrical connection to the processing circuitry disposed in the processor sub-module. The first electrical connector may be electrically connected to the second electrical connector through the printed circuit board.

In another example embodiment, an apparatus is provided. The apparatus may comprise a barrier structure disposed between a first sub-module and a second sub-module. The barrier structure may be configured to restrict flame spread between the first sub-module and the second sub-module. The barrier structure may comprise a first housing part comprising a first cavity structure. The barrier structure may further comprise a second housing part comprising a second cavity structure. The barrier structure may further comprise a printed circuit board comprising a first surface and a second surface opposite the first surface. The printed circuit board may be disposed in a third cavity structure formed by the first cavity structure and the second cavity structure. The barrier structure may further comprise a first electrical connector disposed on the first surface of the printed circuit board and configured to provide a first electrical connection to the first sub-module. The barrier structure may further comprise a second electrical connector disposed on the second surface of the printed circuit board and configured to provide a second electrical connection to the second sub-module. The first electrical connector may be electrically connected to the second electrical connector through the printed circuit board.

In another example embodiment, a method is provided for manufacturing an apparatus for detecting a gas leak. The method may comprise providing a first housing part of a barrier structure. The method may further comprise mounting a printed circuit board to the first housing part. The printed circuit board may comprise a first surface and a second surface opposite the first surface. The printed circuit board may further comprise a first electrical connector disposed on the first surface of the printed circuit board and configured to provide a first electrical connection to a sensor sub-module. The printed circuit board may further comprise a second electrical connector disposed on the second surface of the printed circuit board and configured to provide a second electrical connection to a processor sub-module. The method may further comprise mounting a second housing part of the barrier structure to the first housing part. The printed circuit board may be disposed in a cavity structure positioned between the first housing part and the second housing part. The method may further comprise filling the cavity structure with an encapsulation material.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will be appreciated that the scope of the disclosure encompasses many potential embodiments in addition to those summarized above, some of which will be further described below.

BRIEF DESCRIPTION OF THE DRAWINGS

Having described certain example embodiments of the present disclosure in general terms above, reference will now be made to the accompanying drawings, which illustrate example embodiments and features of the present disclosure and are not necessarily drawn to scale. It will be understood that the components and structures illustrated in the drawings may or may not be present in various embodiments of the disclosure described herein. Accordingly, some embodiments or features of the present disclosure may include fewer or more components or structures than those shown in the drawings while not departing from the scope of the disclosure.

DETAILED DESCRIPTION

Figure 1:
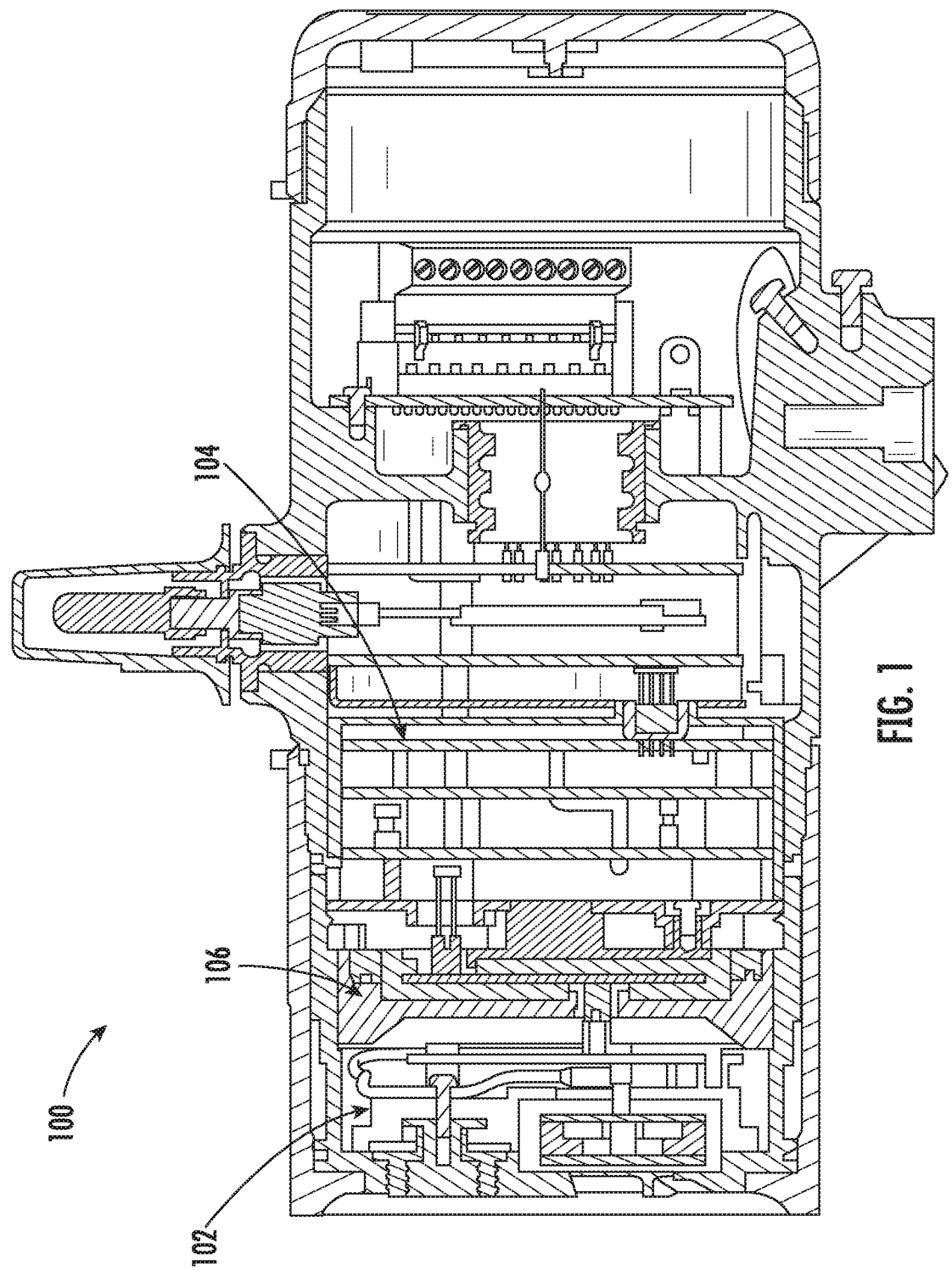
FIG. 1 illustrates an example cross-sectional view of an example ultrasonic gas leak detector in accordance with some example embodiments described herein.

The following description should be read with reference to the drawings wherein like reference numerals indicate like elements throughout the several views. The detailed description and drawings show several embodiments which are meant to be illustrative of the disclosure. It should be understood that any numbering of disclosed features (e.g., first, second, etc.) and/or directional terms used in conjunction with disclosed features (e.g., front, back, top, bottom, side, and the like) are relative terms indicating illustrative relationships between the pertinent features.

It should be understood at the outset that although illustrative implementations of one or more aspects are illustrated below, the disclosed assemblies, systems, and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents. While values for dimensions of various elements are disclosed, the drawings may not be to scale.

The word "example," when used herein, is intended to mean "serving as an example, instance, or illustration." Any implementation described herein as an "example" is not necessarily preferred or advantageous over other implementations.

Electronic devices, such as gas leak detectors, dedicated to work in explosive environments must be designed to prevent ignition and spread of flames. Physical separation of electrically connected sub-modules, such as sensor and processor sub-modules, of the gas leak detector may assist with the prevention of flame ignition and flame spread. However, flame spread between the individual sub-modules must be prevented, restricted, or both to meet safety standards.

The disclosure solves these flame spread requirements by describing a unique design for an ultrasonic gas leak detector. Generally, an ultrasonic gas detector is split to multiple volumes by gas-tight barriers. For instance, the barrier between the sensor sub-module and the processor sub-module comprises two stainless steel housing parts which surround printed circuit board (PCB) with a soldered electrical connector on each side and encapsulated (e.g., over-molded) by epoxy resin. In some embodiments, each electrical connector and stainless steel housing part is sealed with silicone gaskets to prevent leakage of epoxy resin during encapsulation. In some embodiments, the two stainless steel housing parts are fixed together using four screws. In some embodiments, the barrier subassembly is held in place by a ring with thread along the outside diameter. In some embodiments, the orientation of the barrier is secured with hole structures from the sensor sub-module side fitted in columns. In some instances, this design allows the ultrasonic gas leak detector to meet all of the flame spread requirements, provide the proper orientation of connected sub-modules on the sensor sub-module side, and minimize the overall length of the ultrasonic gas leak detector (e.g., by minimizing the overall length of the barrier structure).

Example embodiments described herein provide systems, apparatuses, and methods for an ultrasonic gas leak detector design which provides a barrier between electrically connected sensor and processor sub-modules. The barrier comprises a first housing part on the sensor sub-module side, a second housing part on the processor sub-module side, and an encapsulated PCB disposed between the two housing parts. The PCB comprises vertically offset electrical connectors to provide an electrical connection between the sensor sub-module and the processor sub-module.

Although the disclosure describes the features of the barrier with reference to an ultrasonic gas leak detector, the barrier disclosed herein may be applied in any suitable detector, sensor, gauge, instrument, or application where flame spread prevention or restriction between electrically connected sub-modules is desired.

FIG. 1 illustrates an example cross-sectional view of an example ultrasonic gas leak detector 100 in accordance with some example embodiments described herein. The example ultrasonic gas leak detector 100 comprises a sensor sub-module 102, a processor sub-module 104, and a barrier 106. The barrier 106 may be configured to provide an electrical connection between the sensor sub-module 102 and the processor sub-module 104. The barrier 106 may be further configured to secure flame spread restriction requirements by preventing or restricting flame spread between the sensor sub-module 102 and the processor sub-module 104. In some embodiments, a maximum length of the barrier 106 excluding mounting structures is less than about 15 millimeters. In some embodiments, a maximum length of the barrier 106 including mounting structures is less than about 30 millimeters. In some embodiments, a maximum diameter of the barrier 106 is less than about 90 millimeters.

Figure 2A:
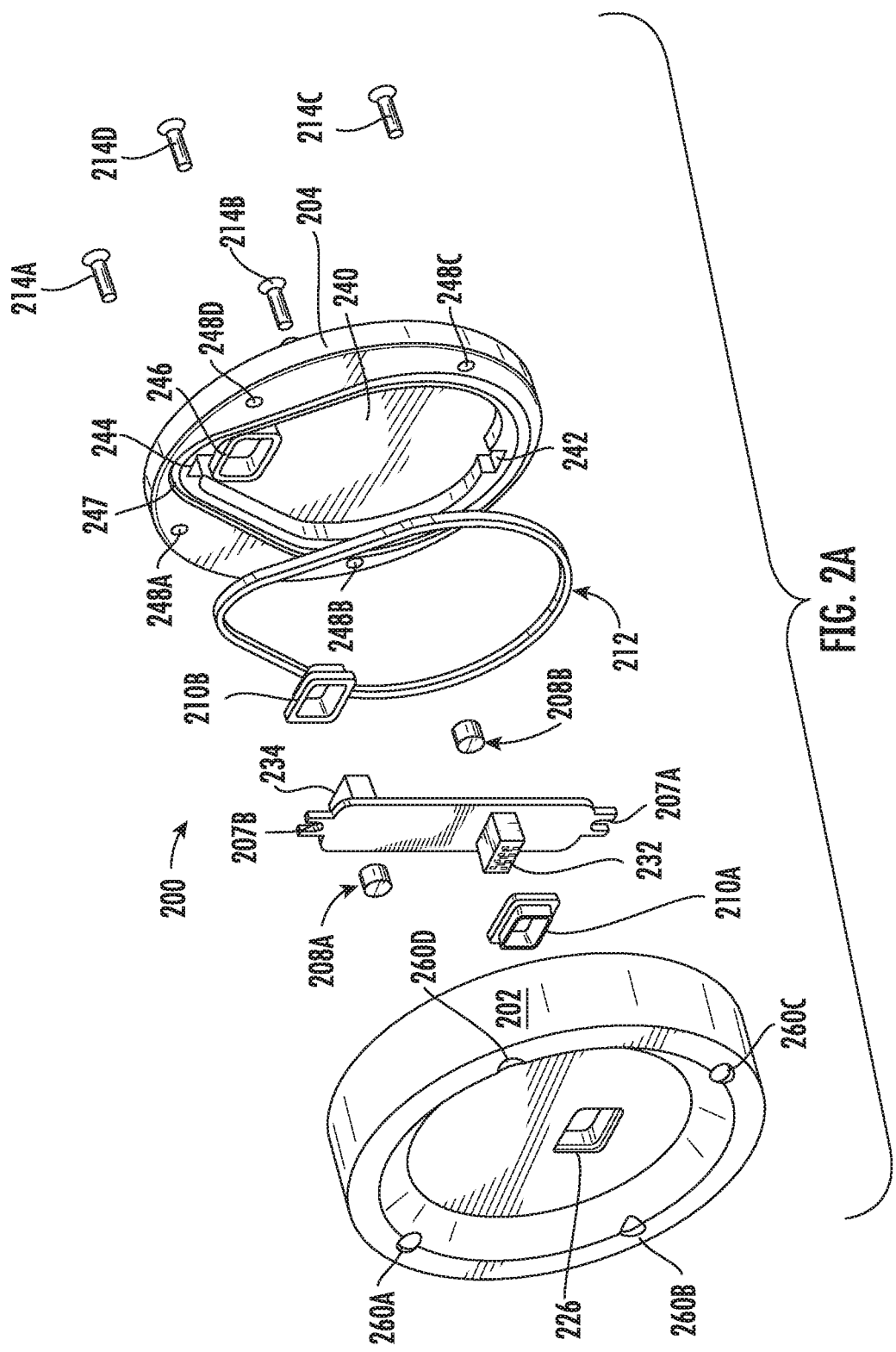
FIGS. 2A and 2B illustrate example exploded views of an example barrier in accordance with some example embodiments described herein.
Figure 2B:
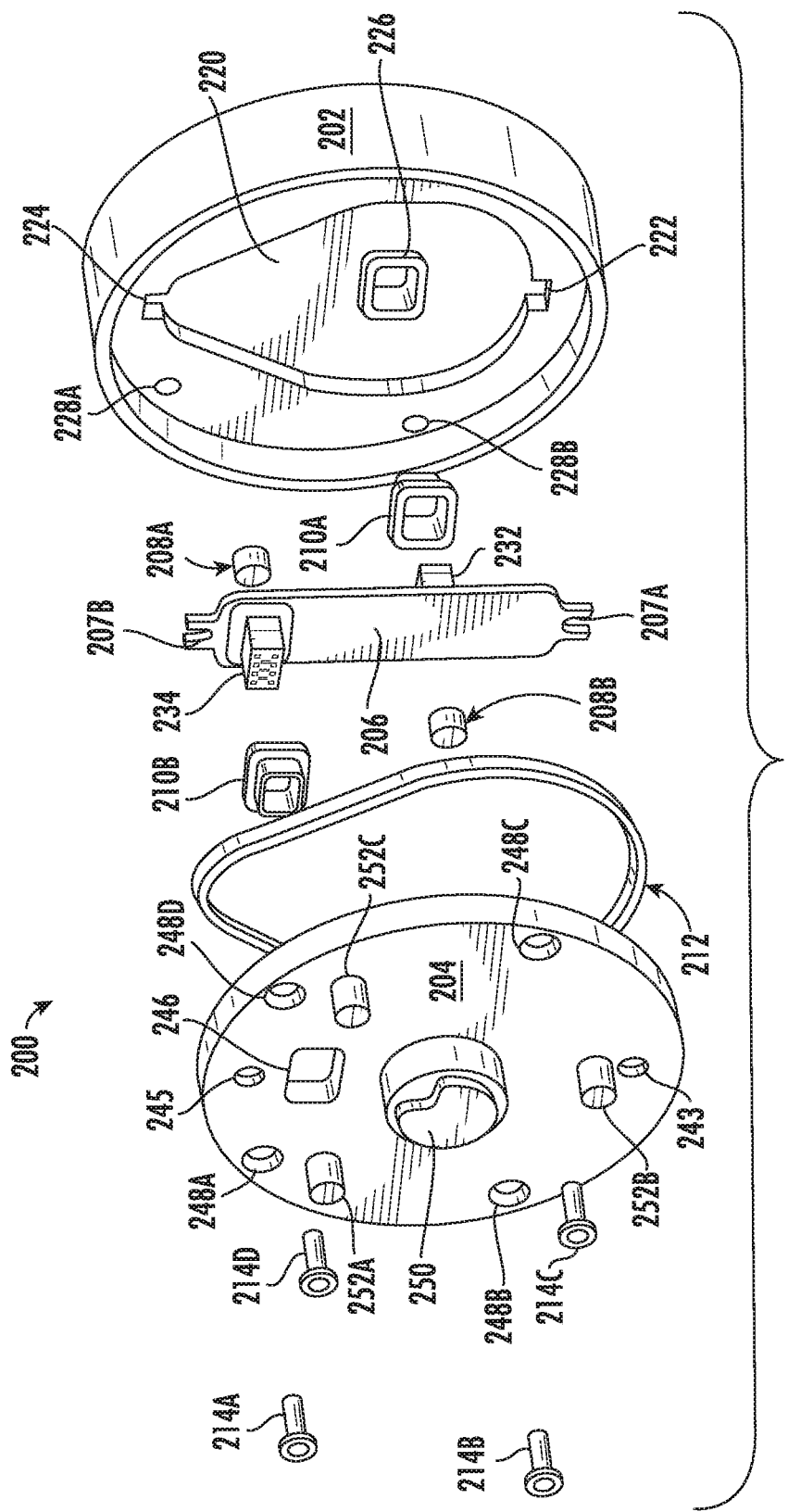

FIGS. 2A and 2B illustrate example exploded views of an example barrier 200 in accordance with some example embodiments described herein. In some embodiments, a maximum length of the barrier 200 excluding mounting structures (e.g., excluding processing circuitry mounting structures 250 and 252A-252C) is less than about 15 millimeters. In some embodiments, a maximum length of the barrier 200 including mounting structures (e.g., including processing circuitry mounting structures 250 and 252A-252C) is less than about 30 millimeters. In some embodiments, a maximum diameter of the barrier 200 is less than about 90 millimeters.

The example barrier 200 comprises a first housing part 202 on the sensor sub-module side of an ultrasonic gas leak detector, a second housing part 204 on the processor sub-module side of the ultrasonic gas leak detector, and a PCB 206 configured to be encapsulated in a cavity structure disposed between the first housing part 202 and the second housing part 204. In some embodiments, the first housing part 202 may comprise stainless steel (e.g., the first housing part 202 may be a stainless steel housing part). In some embodiments, the second housing part 204 may comprise stainless steel (e.g., the second housing part 204 may be a stainless steel housing part). In some embodiments, the first housing part 202 may comprise aluminum (e.g., the first housing part 202 may be an aluminum steel housing part). In some embodiments, the second housing part 204 may comprise aluminum (e.g., the second housing part 204 may be an aluminum housing part).

In some embodiments, as shown in FIG. 2A, the first housing part 202 may comprise one or more sensor circuitry mounting structures, such as a first sensor circuitry mounting structure 260A, a second sensor circuitry mounting structure 260B, a third sensor circuitry mounting structure 260C, a fourth sensor circuitry mounting structure 260D, any other suitable sensor circuitry mounting structures, or a combination thereof.

In some embodiments, as shown in FIGS. 2A and 2B, the first housing part 202 may comprise a first electrical connector mounting structure 226 configured to receive and support a first electrical connector mounting gasket 210A that may be configured to support a first electrical connector 232. In some embodiments, the first electrical connector mounting gasket 210A may be configured to provide sealing for the first electrical connector 232 prior to assembly and encapsulation. In some embodiments, the first electrical connector mounting gasket 210A may comprise silicone or ethylene propylene diene monomer (EPDM) rubber (e.g., the first electrical connector mounting gasket 210A may be a silicone gasket or an EPDM rubber gasket).

In some embodiments, as shown in FIG. 2B, the first housing part 202 may comprise: a first cavity structure 220; a third PCB mounting structure 222 configured to support a first encapsulation flow structure 207A disposed on a bottom side of the PCB 206; and a fourth PCB mounting structure 224 configured to support a second encapsulation flow structure 207B disposed on a top side of the PCB 206. In some embodiments, as shown in FIG. 2B, the first housing part 202 may comprise mounting structures 228A-228D (e.g., threaded holes) configured to receive and support fasteners 214A-214D (e.g., hexalobular countersunk head stainless steel screws, other screws, bolts, clamps, or the like). In some embodiments, the mounting structures 228A-228D may comprise: a first mounting structure 228A configured to receive and support a first fastener 214A; a second mounting structure 228B configured to receive and support a second fastener 214B; a third mounting structure 228C (not shown due to perspective of exploded views) configured to receive and support a third fastener 214C; and a fourth mounting structure 228D (not shown due to perspective of exploded views) configured to receive and support a fourth fastener 214D.

In some embodiments, as shown in FIG. 2A, the second housing part 204 may comprise: a second cavity structure 240; a first PCB mounting structure 242 configured to support the first encapsulation flow structure 207A disposed on the bottom side of the PCB 206; and a second PCB mounting structure 244 configured to support the second encapsulation flow structure 207B disposed on the top side of the PCB 206. In some embodiments, as shown in FIG. 2A, the second housing part 204 may comprise an encapsulation gasket mounting structure 247 configured to support an encapsulation gasket 212. In some embodiments, the encapsulation gasket 212 may comprise silicone or EPDM rubber (e.g., the encapsulation gasket 212 may be a silicone gasket or an EPDM rubber gasket).

In some embodiments, the first cavity structure 220 and the second cavity structure 240 may be configured to form a cavity structure positioned between the first housing part 202 and the second housing part 204. The PCB 206 may be configured to be disposed in the cavity structure formed by the first cavity structure 220 and the second cavity structure 240. In some instances, the cavity structure may be sealed by the encapsulation gasket 212. The PCB 206 may be further configured to be encapsulated by an encapsulation material. The encapsulation material may be any suitable encapsulation material, such as an epoxy resin (e.g., a room temperature cure, two-component epoxy potting and encapsulating material). In some embodiments, the encapsulation gasket 212 may be configured to restrict the flow of the encapsulation material to the cavity structure formed by the first cavity structure 220 and the second cavity structure 240.

In some embodiments, as shown in FIGS. 2A and 2B, the second housing part 204 may comprise a second electrical connector mounting structure 246 configured to receive and support a second electrical connector mounting gasket 210B that may be configured to support a second electrical connector 234. In some embodiments, the second electrical connector mounting gasket 210B may be configured to provide sealing for the second electrical connector 234 prior to assembly and encapsulation. In some embodiments, the second electrical connector mounting gasket 210B may comprise silicone or EPDM rubber (e.g., the second electrical connector mounting gasket 210B may be a silicone gasket or an EPDM rubber gasket).

In some embodiments, as shown in FIGS. 2A and 2B, the second housing part 204 may comprise mounting structures 248A-248D (e.g., holes) configured to receive and support the fasteners 214A-214D. In some embodiments, the mounting structures 248A-248D may comprise: a first mounting structure 248A configured to receive and support the first fastener 214A; a second mounting structure 248B configured to receive and support the second fastener 214B; a third mounting structure 248C configured to receive and support the third fastener 214C; and a fourth mounting structure 248D configured to receive and support the fourth fastener 214D.

In some embodiments, as shown in FIG. 2B, the second housing part 204 may comprise: an encapsulation entry structure 243 (e.g., a hole in fluidic communication with the first PCB mounting structure 242) configured to provide an entrance for an encapsulation material into the cavity structure; and an encapsulation exit structure 245 (e.g., a hole in fluidic communication with the second PCB mounting structure 244) configured to provide an exit for encapsulation material out of the cavity structure. The encapsulation entry structure 243 may be in fluidic communication with the first PCB mounting structure 242, the second cavity structure 240, the first encapsulation flow structure 207A, the third PCB mounting structure 222, the first cavity structure 220, the second PCB mounting structure 244, the second encapsulation flow structure 207B, and the fourth PCB mounting structure 224. In some embodiments, as shown in FIG. 2B, the second housing part 204 may comprise one or more processing circuitry mounting structures, such as a first processing circuitry mounting structure 252A, a second processing circuitry mounting structure 252B, a third processing circuitry mounting structure 252C, a fourth processing circuitry mounting structure 250, any other suitable sensor circuitry mounting structures, or a combination thereof.

In some embodiments, as shown in FIGS. 2A and 2B, the PCB 206 may comprise one or more encapsulation flow structures configured to promote the flow of encapsulation material around the PCB 206, such as: a first encapsulation flow structure 207A disposed on the bottom side of the PCB 206 and configured to be disposed between the third PCB mounting structure 222 of the first housing part 202 and the first PCB mounting structure 242 of the second housing part 204; and a second encapsulation flow structure 207B disposed on the top side of the PCB 206 and configured to be disposed between the fourth PCB mounting structure 224 of the first housing part 202 and the second PCB mounting structure 244 of the second housing part 204.

In some embodiments, as shown in FIGS. 2A and 2B, the PCB 206 may comprise a first electrical connector 232 disposed on a first side (e.g., the sensor sub-module side) of the PCB 206; and a second electrical connector 234 disposed on a second side (e.g., the processor sub-module side) of the PCB 206. In some embodiments, each of the first electrical connector 232 and the second electrical connector 234 may be a feedthrough PCB encapsulated electrical connector. In some embodiments, the first electrical connector 232 and the second electrical connector 234 may be configured to provide a one-to-one (e.g., pin-to-pin) electrical connection through the PCB 206 from the sensor circuitry disposed in the sensor sub-module (e.g., the sensor sub-module 102) to the processing circuitry disposed in the processor sub-module (e.g., the processor sub-module 104). In some embodiments, the first electrical connector 232 and the second electrical connector 234 may be vertically offset by at least 16 millimeters or at least 5/8 inches.

In some embodiments, as shown in FIGS. 2A and 2B, a first spacer 208A may be disposed on the first surface the PCB 206, and a second spacer 208B may be disposed on the second surface the PCB 206. In some embodiments, each of the first spacer 208A and the second spacer 208B may be a gasket (e.g., a silicone gasket or an EPDM rubber gasket) configured to provide support for the PCB 206 prior to encapsulation.

Figure 3A:
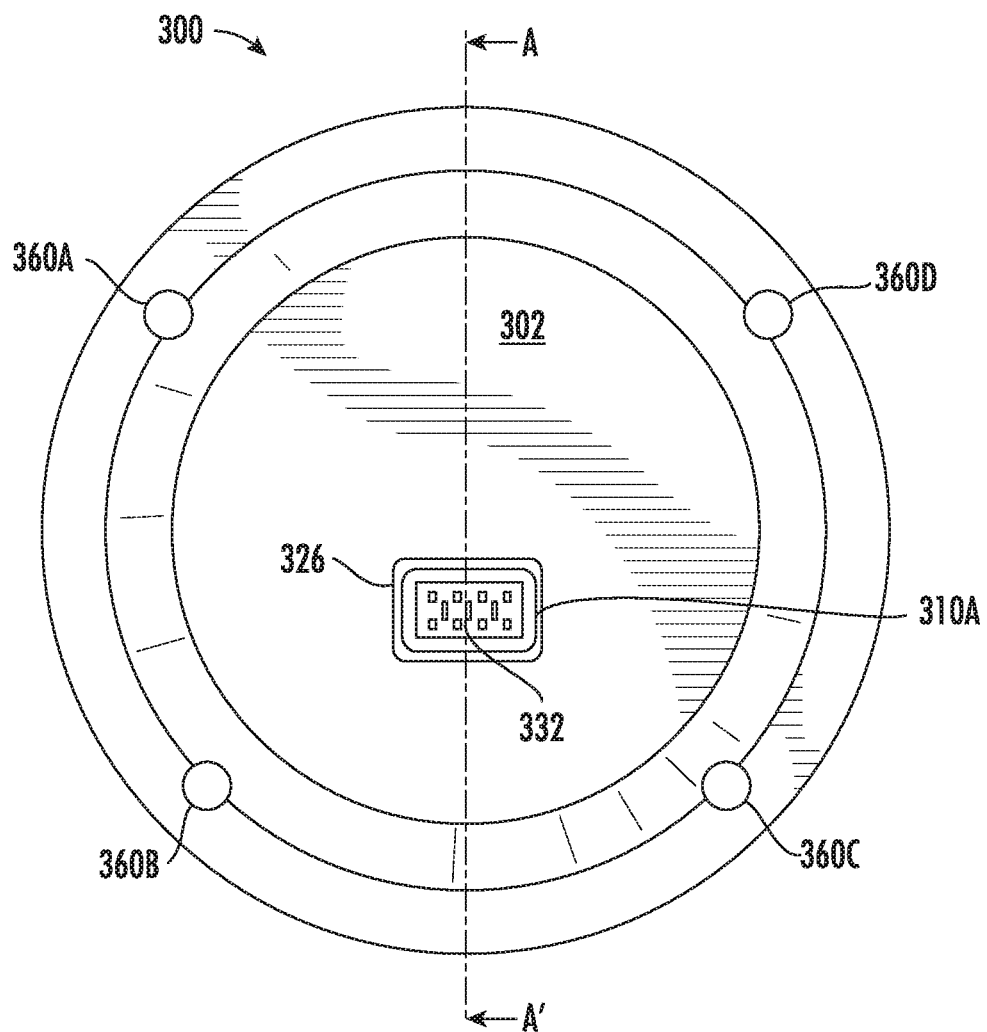
FIG. 3A illustrates an example front view of an example barrier in accordance with some example embodiments described herein.
Figure 3B:
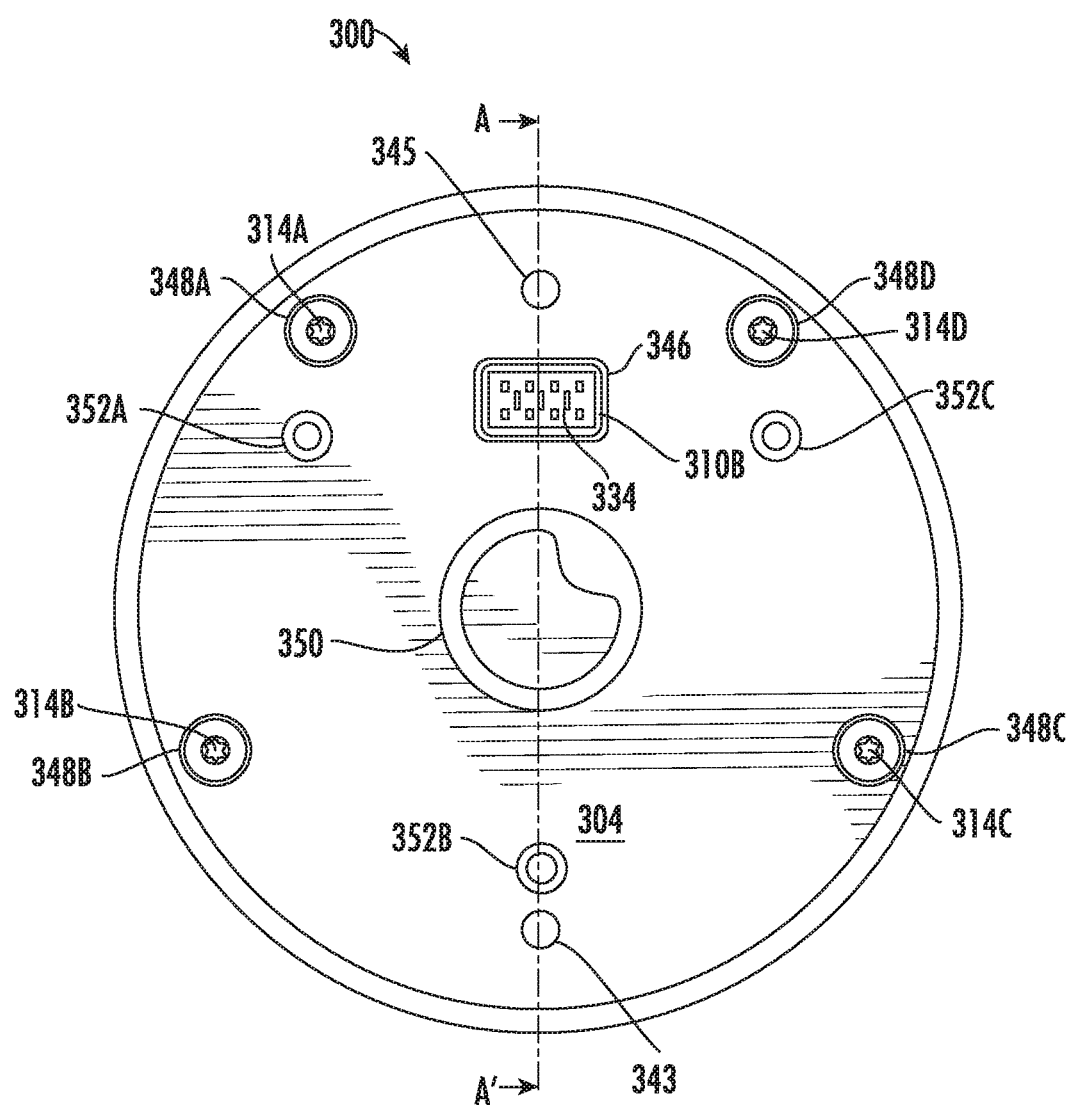
FIG. 3B illustrates an example rear view of an example barrier in accordance with some example embodiments described herein.
Figure 3C:
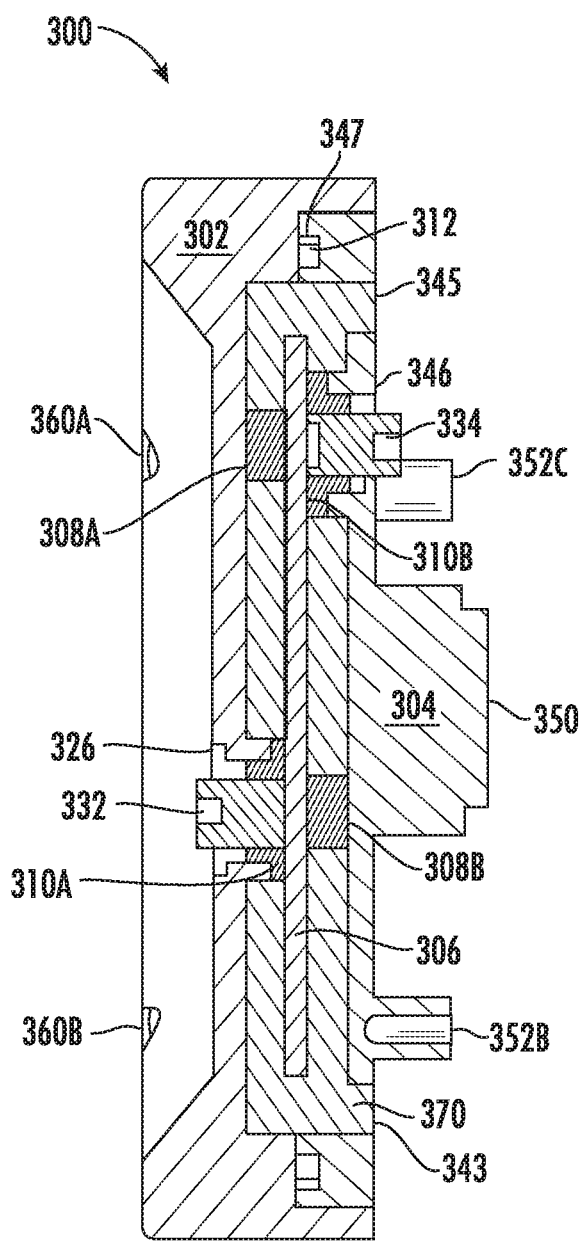
FIG. 3C illustrates an example cross-sectional view of an example barrier in accordance with some example embodiments described herein.

FIGS. 3A-3C illustrate example views of an example barrier 300 comprising a first housing part 302, a second housing part 304, and a PCB 306 in accordance with some example embodiments described herein. In some embodiments, the components, structures, or material compositions of the example barrier 300 may be the same as or substantially similar to the components, structures, and material compositions described with reference to the example barrier 200 shown in FIG. 2.

FIG. 3A illustrates an example front view of an example barrier 300 comprising a first housing part 302 in accordance with some example embodiments described herein. In some embodiments, the first housing part 302 may comprise one or more sensor circuitry mounting structures, such as a first sensor circuitry mounting structure 360A, a second sensor circuitry mounting structure 360B, a third sensor circuitry mounting structure 360C, a fourth sensor circuitry mounting structure 360D, any other suitable sensor circuitry mounting structures, or a combination thereof. In some embodiments, the first housing part 302 may comprise a first electrical connector mounting structure 326 configured to receive and support a first electrical connector mounting gasket 310A that may be configured to support a first electrical connector 332. In some embodiments, the first electrical connector mounting gasket 310A may be configured to provide sealing for the first electrical connector 332 prior to assembly and encapsulation.

FIG. 3B illustrates an example rear view of the example barrier 300 comprising a second housing part 304 in accordance with some example embodiments described herein. In some embodiments, the second housing part 304 may comprise a second electrical connector mounting structure 346 configured to receive and support a second electrical connector mounting gasket 310B that may be configured to support a second electrical connector 334. In some embodiments, the second electrical connector mounting gasket 310B may be configured to provide sealing for the second electrical connector 334 prior to assembly and encapsulation.

In some embodiments, the second housing part 304 may comprise an encapsulation entry structure 343 and an encapsulation exit structure 345. In some embodiments, the second housing part 304 may comprise mounting structures 348A-348D (e.g., holes) configured to receive and support the fasteners 314A-314D (e.g., hexalobular countersunk head stainless steel screws, other screws, bolts, clamps, or the like). In some embodiments, the mounting structures 348A-348D may comprise: a first mounting structure 348A configured to receive and support the first fastener 314A; a second mounting structure 348B configured to receive and support the second fastener 314B; a third mounting structure 348C configured to receive and support the third fastener 314C; and a fourth mounting structure 348D configured to receive and support the fourth fastener 314D. In some embodiments, the second housing part 304 may comprise one or more processing circuitry mounting structures, such as a first processing circuitry mounting structure 352A, a second processing circuitry mounting structure 352B, a third processing circuitry mounting structure 352C, a fourth processing circuitry mounting structure 350, any other suitable sensor circuitry mounting structures, or a combination thereof.

FIG. 3C illustrates an example cross-sectional view of an example cross-section A-A of the example barrier 300 in accordance with some example embodiments described herein. As shown in FIG. 3C, the example barrier 300 may comprise the first housing part 302, the second housing part 304, and a PCB 306 encapsulated by an encapsulation material 370. In some embodiments, the encapsulation material 370 may be an epoxy resin such as a two-part epoxy resin (e.g., a room temperature cure, two-component epoxy potting and encapsulating material). In some embodiments, each of the first electrical connector 332, the first electrical connector mounting gasket 310A, and the first spacer 308A may be disposed on a first side (e.g., the sensor sub-module side) of the PCB 306; and each of the second electrical connector 334, the second electrical connector mounting gasket 310B, and the second spacer 308B may be disposed on a second side (e.g., the processor sub-module side) of the PCB 306. In some embodiments, each of the first electrical connector 332 and the second electrical connector 334 may be a feedthrough PCB encapsulated electrical connector. In some embodiments, the first electrical connector 332 and the second electrical connector 334 may be configured to provide a one-to-one (e.g., pin-to-pin) electrical connection through the PCB 306 from the sensor circuitry disposed in the sensor sub-module to the processing circuitry disposed in the processor sub-module. In some embodiments, the first electrical connector 332 and the second electrical connector 334 may be vertically offset by at least 16 millimeters or at least 5/8 inches. In some embodiments, the example barrier 300 may comprise an encapsulation gasket 312 disposed in an encapsulation gasket mounting structure 347 of the second housing part 304 to restrict the flow of the encapsulation material 370 to the cavity structure.

In some embodiments, a maximum length of the barrier 300 excluding mounting structures (e.g., excluding processing circuitry mounting structures 350 and 352A-352C) is less than about 15 millimeters. In some embodiments, a maximum length of the barrier 300 including mounting structures (e.g., including processing circuitry mounting structures 350 and 352A-352C) is less than about 30 millimeters. In some embodiments, a maximum diameter of the barrier 300 is less than about 90 millimeters.

Having described specific components and structures of example devices involved in the present disclosure, example procedures for providing an ultrasonic gas leak detector comprising a barrier between a sensor sub-module and a processor sub-module are described below in connection with FIG. 4.

Figure 4:
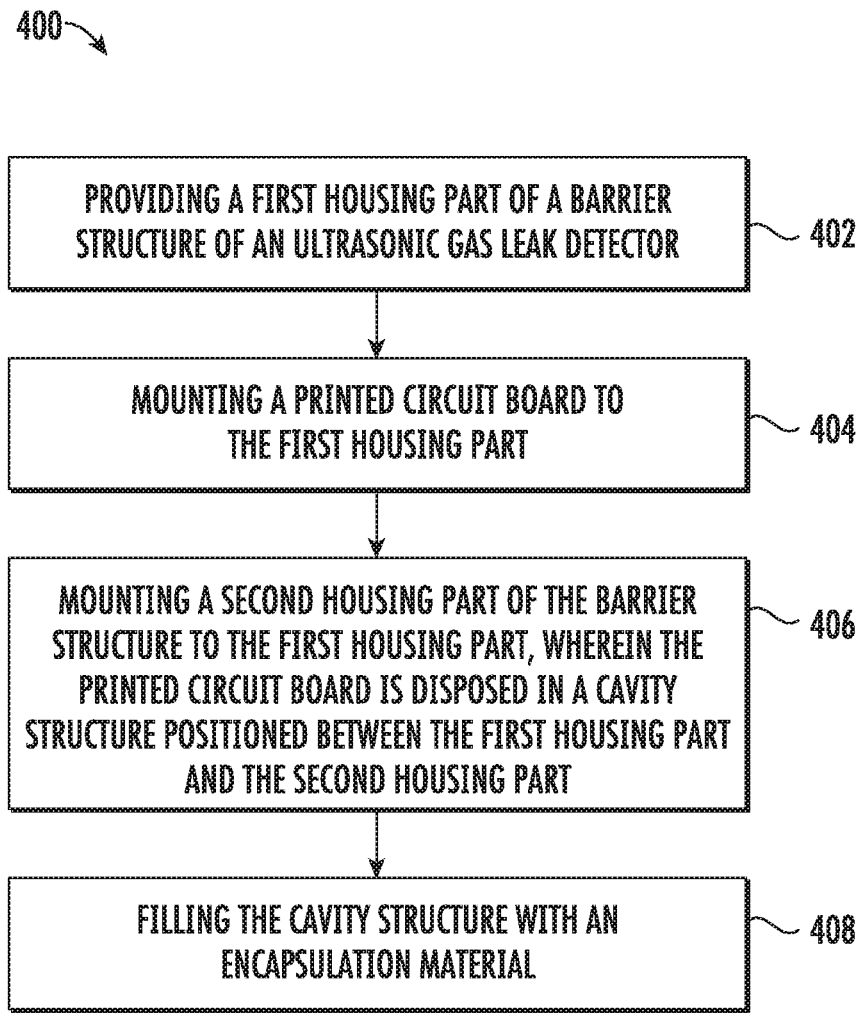
FIG. 4 illustrates an example flowchart illustrating an example method in accordance with some example embodiments described herein.

FIG. 4 illustrates an example flowchart 400 that contains example operations for providing a barrier structure between the sensor and processor sub-modules of an ultrasonic gas leak detector according to some example embodiments described herein.

As shown by operation 402, the example flowchart 400 may begin by providing a first housing part (e.g., first housing part 202, 302) of a barrier structure (e.g., barrier 106, 200, 300) of an ultrasonic gas leak detector (e.g., ultrasonic gas leak detector 100).

As shown by operation 404, the example flowchart 400 may proceed to mounting a PCB (e.g., PCB 206, 306) to a surface of the first housing part. For example, operation 404 may further comprise attaching (e.g., using an adhesive) a first surface of a first spacer (e.g., first spacer 208A, 308A) to a first surface of the PCB (e.g., on the sensor sub-module side of the PCB). Operation 404 may further comprise attaching a first electrical connector mounting gasket (e.g., first electrical connector mounting gasket 210A, 310A) to a first electrical connector mounting structure (e.g., first electrical connector mounting structure 226, 326) of the first housing part. Operation 404 may further comprise inserting a first electrical connector (e.g., first electrical connector 232, 332) disposed on the first surface of the PCB into the first electrical connector mounting gasket. Operation 404 may further comprise disposing a first surface of a first encapsulation flow structure (e.g., first encapsulation flow structure 207A) of the PCB in a PCB mounting structure (e.g., third PCB mounting structure 222) of the first housing part. Operation 404 may further comprise disposing a first surface of a second encapsulation flow structure (e.g., second encapsulation flow structure 207B) of the PCB in a PCB mounting structure (e.g., fourth PCB mounting structure 224) of the first housing part. Operation 404 may further comprise contacting a second surface of the first spacer to a surface of the first housing part.

As shown by operation 406, the example flowchart 400 may proceed to mounting a second housing part (e.g., second housing part 204, 304) of the barrier structure to the first housing part. For example, operation 406 may comprise disposing an encapsulation gasket (e.g., encapsulation gasket 212, 312) in an encapsulation gasket mounting structure (e.g., encapsulation gasket mounting structure 247, 347) of the second housing part. Operation 406 may further comprise attaching a first surface of a second spacer (e.g., second spacer 208B, 308B) to a second surface of the PCB (e.g., on the processor sub-module side of the PCB). Operation 406 may comprise attaching a second electrical connector mounting gasket (e.g., second electrical connector mounting gasket 210B, 310B) to a second electrical connector mounting structure (e.g., second electrical connector mounting structure 246, 346) of the second housing part. Operation 406 may further comprise inserting a second electrical connector (e.g., second electrical connector 234, 334) disposed on the second surface of the PCB into the second electrical connector mounting gasket. Operation 404 may further comprise disposing a second surface of the first encapsulation flow structure of the PCB in a PCB mounting structure (e.g., first PCB mounting structure 242) of the second housing part. Operation 404 may further comprise disposing a second surface of the second encapsulation flow structure of the PCB in a PCB mounting structure (e.g., second PCB mounting structure 244) of the second housing part. Operation 404 may further comprise contacting a second surface of the second spacer to a surface of the second housing part. Operation 404 may further comprise inserting fasteners (e.g., fasteners 214A-214D, 314A-314D) into mounting structures (e.g., mounting structures 248A-248D) of the second housing part. Operation 404 may further comprise inserting the fasteners into mounting structures (e.g., mounting structures 228A-228D) of the first housing part. Operation 404 may further comprise tightening the fasteners to secure the second housing part to the first housing part. After the second housing part is secured to the first housing part at operation 406, the encapsulation gasket may be configured to restrict the flow of the encapsulation material to the cavity structure.

As shown by operation 408, the example flowchart 400 may proceed to filling the cavity structure (e.g., a cavity structure formed by the cavity structure 220, the cavity structure 240 and the encapsulation gasket 212) with an encapsulation material (e.g., an epoxy resin). For example, operation 408 may comprise injecting the encapsulation material into an encapsulation entry structure (e.g., encapsulation entry structure 243, 343) of the second housing part. Upon and during the injection of the encapsulation material, the encapsulation material may enter the encapsulation entry structure 243 and flow into the cavity structure through the lower PCB mounting structures (e.g., the first PCB mounting structure 242, 342; the third PCB mounting structure 222, 322; and, in some instances, the first encapsulation flow structure 207A). The injection of the encapsulation material may continue until the cavity structure is filled by the encapsulation material. Subsequently, the encapsulation material may flow through the upper PCB mounting structures (e.g., the fourth PCB mounting structure 224, 324; the second PCB mounting structure 244, 344; and, in some instances, the second encapsulation flow structure 207B) and exit the cavity structure through the encapsulation exit structure (e.g., encapsulation exit structure 245, 345) of the second housing part. In some embodiments, operation 408 may comprise curing the encapsulation material. In one illustrative example, the encapsulation material may be a room temperature cure, two-component epoxy potting and encapsulating material. In this illustrative example, operation 408 may comprise mixing the encapsulation material; vacuuming the mixed encapsulation material for about 5 minutes at a range of about 5 mm Hg absolute to about 10 mm Hg absolute; injecting the mixed and vacuumed encapsulation material through the encapsulation entry structure; and, after filling the cavity structure and encapsulating the PCB (e.g., once the encapsulation material begins to exit the encapsulation entry structure), curing the injected encapsulation material for about 18 hours at about 25 degrees Celsius followed by 2 hours at about 100 degrees Celsius.

Optionally (not shown in FIG. 4 for the sake of brevity), after curing the encapsulation material the example flowchart 400 may proceed to: fit assembling the barrier structure to a pre-assembled microphone cover and then to a front housing of the ultrasonic gas leak detector via a cylindrical flame path of the ultrasonic gas leak detector; and locking the barrier structure assembly using a threaded lock ring.

In some embodiments, operations 402, 404, 406, and 408 may not necessarily occur in the order depicted in FIG. 4. In some embodiments, one or more of the operations depicted in FIG. 4 may occur substantially simultaneously. In some embodiments, one or more additional operations may be involved before, after, or between any of the operations shown in FIG. 4.

As described above, FIG. 4 illustrates an example flowchart describing operations performed in accordance with example embodiments of the present disclosure. It will be understood that each block of the flowchart, and combinations of blocks in the flowchart, may be implemented by various means, such as devices comprising hardware, firmware, one or more processors, and/or circuitry associated with execution of software comprising one or more computer program instructions. For example, one or more of the procedures described above may be performed by material handling equipment (e.g., a robotic arm, servo motor, motion controllers, and the like) and computer program instructions residing on a non-transitory computer-readable storage memory. In this regard, the computer program instructions which embody the procedures described above may be stored by a memory of an apparatus employing an embodiment of the present disclosure and executed by a processor of the apparatus. As will be appreciated, any such computer program instructions may be loaded onto a computer or other programmable apparatus (e.g., hardware) to produce a machine, such that the resulting computer or other programmable apparatus provides for implementation of the functions specified in the flowchart blocks. When executed, the instructions stored in the computer-readable storage memory produce an article of manufacture configured to implement the various functions specified in flowchart blocks. Moreover, execution of a computer or other processing circuitry to perform various functions converts the computer or other processing circuitry into a particular machine configured to perform an example embodiment of the present disclosure.

Accordingly, the described flowchart blocks support combinations of means for performing the specified functions and combinations of operations for performing the specified functions. It will also be understood that one or more flowchart blocks, and combinations of flowchart blocks, can be implemented by special purpose hardware-based computer systems which perform the specified functions, or combinations of special purpose hardware that execute computer instructions.

In some example embodiments, certain ones of the operations herein may be modified or further amplified as described below. Moreover, in some embodiments additional optional operations may also be included. It should be appreciated that each of the modifications, optional additions or amplifications described herein may be included with the operations herein either alone or in combination with any others among the features described herein.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," and similar words are not intended to limit the order of the steps; these words are simply used to guide the reader through the description of the methods. Further, any reference to claim elements in the singular, for example, using the articles "a," "an" or "the," is not to be construed as limiting the element to the singular and may, in some instances, be construed in the plural.

As described above and with reference to FIGS. 1-4, example embodiments of the present disclosure thus provide for an ultrasonic gas leak detector which provides a barrier structure to prevent or restrict flame spread between sub-modules of the ultrasonic gas leak detector, such as a sensor sub-module and a processor sub-module. Thus, the ultrasonic gas leak detector disclosed herein may easily and cost-effectively meet all of the flame spread requirements and also provide the proper orientation of connected sub-modules on the sensor sub-module side as well as minimize the overall length of the ultrasonic gas leak detector.

While various embodiments in accordance with the principles disclosed herein have been shown and described above, modifications thereof may be made by one skilled in the art without departing from the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification and the claims are embodiment(s) of the present disclosure. Furthermore, any advantages and features described above may relate to specific embodiments, but shall not limit the application of such issued claims to processes and structures accomplishing any or all of the above advantages or having any or all of the above features.

In addition, the section headings used herein are provided for consistency with the suggestions under 37 C.F.R. § 1.77 or to otherwise provide organizational cues. These headings shall not limit or characterize the disclosure set out in any claims that may issue from this disclosure. For instance, a description of a technology in the "Background" is not to be construed as an admission that certain technology is prior art to any disclosure in this disclosure. Neither is the "Summary" to be considered as a limiting characterization of the disclosure set forth in issued claims. Furthermore, any reference in this disclosure to "disclosure" or "embodiment" in the singular should not be used to argue that there is only a single point of novelty in this disclosure. Multiple embodiments of the present disclosure may be set forth according to the limitations of the multiple claims issuing from this disclosure, and such claims accordingly define the disclosure, and their equivalents, that are protected thereby. In all instances, the scope of the claims shall be considered on their own merits in light of this disclosure, but should not be constrained by the headings set forth herein.

Also, techniques, systems, subsystems, and methods described and illustrated in the various embodiments as discrete or separate may be combined or integrated with other systems, modules, techniques, or methods without departing from the scope of the present disclosure. Other devices or components shown or discussed as coupled to, or in communication with, each other may be indirectly coupled through some intermediate device or component, whether electrically, mechanically, or otherwise. Other examples of changes, substitutions, and alterations are ascertainable by one skilled in the art and could be made without departing from the scope disclosed herein.

Many modifications and other embodiments of the disclosure set forth herein will come to mind to one skilled in the art to which these embodiments pertain having the benefit of teachings presented in the foregoing descriptions and the associated figures. Although the figures only show certain components of the apparatus and systems described herein, it is understood that various other components may be used in conjunction with the components and structures disclosed herein. Therefore, it is to be understood that the disclosure is not to be limited to the specific embodiments disclosed and that modifications and other embodiments are intended to be included within the scope of the appended claims. For example, the various elements or components may be combined, rearranged, or integrated in another system or certain features may be omitted or not implemented. Moreover, the steps in any method described above may not necessarily occur in the order depicted in the accompanying drawings, and in some cases one or more of the steps depicted may occur substantially simultaneously, or additional steps may be involved. Although specific terms are employed herein, they are used in a generic and descriptive sense only and not for purposes of limitation.

The invention claimed is:

1. A system for detecting a gas leak, the system comprising:
   a sensor sub-module comprising sensor circuitry;
   a processor sub-module comprising processing circuitry; and
   a barrier structure disposed between the sensor sub-module and the processor sub-module, wherein the barrier structure is configured to restrict flame spread between the sensor sub-module and the processor sub-module, and wherein the barrier structure comprises:
      a first housing part comprising a first cavity structure;
      a second housing part comprising a second cavity structure;
      a printed circuit board comprising a first surface and a second surface opposite the first surface, wherein the printed circuit board is disposed in a third cavity structure formed by the first cavity structure and the second cavity structure;
      a first electrical connector disposed on the first surface of the printed circuit board and configured to provide a first electrical connection to the sensor circuitry disposed in the sensor sub-module; and
      a second electrical connector disposed on the second surface of the printed circuit board and configured to provide a second electrical connection to the processing circuitry disposed in the processor sub-module,
      wherein the first electrical connector is electrically connected to the second electrical connector through the printed circuit board.

2. The system of claim 1, wherein the first housing part comprises stainless steel, and wherein the second housing part comprises stainless steel.

3. The system of claim 1, wherein the first electrical connector and the second electrical connector are vertically offset by at least 16 millimeters.

4. The system of claim 1, wherein the barrier structure further comprises a first electrical connector mounting gasket configured to support the first electrical connector, and wherein the first housing part comprises a first electrical connector mounting structure configured to receive the first electrical connector mounting gasket.

5. The system of claim 1, wherein the barrier structure further comprises a second electrical connector mounting gasket configured to support the second electrical connector, and wherein the second housing part comprises a second electrical connector mounting structure configured to receive the second electrical connector mounting gasket.

6. The system of claim 1, wherein the printed circuit board further comprises:
   a first encapsulation flow structure disposed on a bottom side of the printed circuit board; and
   a second encapsulation flow structure disposed on a top side of the printed circuit board.

7. The system of claim 6, wherein the second housing part further comprises:
   a first PCB mounting structure configured to support the first encapsulation flow structure; and
   a second PCB mounting structure configured to support the second encapsulation flow structure.

8. The system of claim 7, wherein the first housing part further comprises:
   a third PCB mounting structure configured to support the first encapsulation flow structure; and
   a fourth PCB mounting structure configured to support the second encapsulation flow structure.

9. The system of claim 1, wherein the barrier structure further comprises one or more fasteners configured to secure the second housing part to the first housing part.

10. The system of claim 9, wherein the one or more fasteners comprise one or more hexalobular countersunk head stainless steel screws.

11. The system of claim 1, wherein a maximum length of the barrier structure is less than about 30 millimeters.

12. The system of claim 1, wherein a maximum diameter of the barrier structure is less than about 90 millimeters.

13. An apparatus comprising:
   a barrier structure disposed between a first sub-module and a second sub-module, wherein the barrier structure is configured to restrict flame spread between the first sub-module and the second sub-module, and wherein the barrier structure comprises:
      a first housing part comprising a first cavity structure;
      a second housing part comprising a second cavity structure;
      a printed circuit board comprising a first surface and a second surface opposite the first surface, wherein the printed circuit board is disposed in a third cavity structure formed by the first cavity structure and the second cavity structure;
      a first electrical connector disposed on the first surface of the printed circuit board and configured to provide a first electrical connection to the first sub-module; and
      a second electrical connector disposed on the second surface of the printed circuit board and configured to provide a second electrical connection to the second sub-module,
      wherein the first electrical connector is electrically connected to the second electrical connector through the printed circuit board.

14. The apparatus of claim 13, wherein the first housing part comprises stainless steel, and wherein the second housing part comprises stainless steel.

15. The apparatus of claim 13, wherein the barrier structure further comprises an encapsulation gasket.

16. The apparatus of claim 13, wherein the first electrical connector and the second electrical connector are vertically offset by at least 16 millimeters.

17. The apparatus of claim 13, wherein the barrier structure further comprises a first electrical connector mounting gasket configured to support the first electrical connector, and wherein the first housing part comprises a first electrical connector mounting structure configured to receive the first electrical connector mounting gasket.

18. A method for manufacturing an apparatus for detecting a gas leak, the method comprising:
   providing a first housing part of a barrier structure;
   mounting a printed circuit board to the first housing part, wherein the printed circuit board comprises a first surface and a second surface opposite the first surface, wherein the printed circuit board comprises a first electrical connector disposed on the first surface of the printed circuit board and configured to provide a first electrical connection to a sensor sub-module, and wherein the printed circuit board comprises a second electrical connector disposed on the second surface of the printed circuit board and configured to provide a second electrical connection to a processor sub-module;
   mounting a second housing part of the barrier structure to the first housing part, wherein the printed circuit board is disposed in a cavity structure positioned between the first housing part and the second housing part; and
   filling the cavity structure with an encapsulation material.

19. An apparatus manufactured according to the method of claim 18, wherein the method further comprises:
   disposing the barrier structure between the sensor sub-module and the processor sub-module, wherein the barrier structure is configured to restrict flame spread between the sensor sub-module and the processor sub-module.

20. The method of claim 18, wherein the encapsulation material comprises an epoxy resin.

\* \* \* \* \*